United States Patent [19]

Eden

[11] Patent Number: 4,586,164

[45] Date of Patent: Apr. 29, 1986

[54] RANDOM ACCESS MEMORY DEVICE UTILIZING PHASE CHANGE MATERIALS

[75] Inventor: Dayton D. Eden, Dallas, Tex.

[73] Assignee: LTV Aerospace and Defense Company, Dallas, Tex.

[21] Appl. No.: 599,459

[22] Filed: Apr. 12, 1984

[51] Int. Cl.$^4$ .................. G11C 11/42; G11C 13/04
[52] U.S. Cl. .................................... 365/127; 365/157
[58] Field of Search ............... 365/117, 120, 127, 157, 365/113, 163

[56] References Cited

U.S. PATENT DOCUMENTS 4,090,031  5/1978  Russell .................... 365/127

Primary Examiner—Terrell W. Fears
Attorney, Agent, or Firm—Stephen S. Sadacca; J. M. Cate

[57] ABSTRACT

A random access memory device is disclosed which utilizes phase change materials. The memory device includes two overlapping films of a phase change material which exhibits an optically discernible phase change at any portion thereof which is subjected to a selected external stimulus and which exhibits a hysteresis effect such that any such portion is substantially unchanged after the external stimulus is removed. Various phase change materials are disclosed which respond to changes in pressure, temperature or electric field intensities to vary the transmission characteristics of a selected portion of a film of such material from substantially opaque to translucent. One of the two overlapping films is then utilized to record digital data by changing the phase of the material at selected portions thereof. A single selected portion of the second film is then rendered translucent and utilized in conjunction with a powerful light source and a photodetector to ascertain the phase of a particular portion of the first film which underlies the single selected portion of the second film.

25 Claims, 3 Drawing Figures

RANDOM ACCESS MEMORY DEVICE UTILIZING PHASE CHANGE MATERIALS

BACKGROUND OF THE INVENTION

This invention relates to memory devices in general and in particular to random access memory devices. Still more particularly, this invention relates to random access memory devices which utilize phase change materials as the storage medium. Random access memories are well known in the prior art. Early semiconductor experiments in the storage and random retrieval of digital data have led to an entire industry which specializes in the manufacture of such memory devices. Typically, a semiconductor memory device operates by storing and retrieving an electrical charge from a plurality of identifiable locations.

Various other techniques are also utilized in the construction of random access memories. As an example, it is quite common to utilize magnetic domains to store and retrieve a sequence of digital data. Early and bulky core memories have given way to magnetic disks which utilize much smaller magnetic domains to store millions of bits of digital data on small "floppy" disks. While the storage capacity of these magnetic disks is greatly enhanced over known semiconductor memories, the delicacy of these disks and their relatively slow retrieval rates have relegated this technique to applictions where speed is not a factor.

More recently, optical storage media have been utilized for high data rate applications. Initially, such optical data storage disks were utilized as read only memories and were primarily utilized to store the multiple frames of data necessary to reconstruct a video picture. The increases in laser technology which have occurred in conjunction with these disks and the rapidity with which an optical system can function have made the optical storage device a likely candidate for high data rate random access memories. Many attempts have been made in recent years to create an optical erasable access memory utilizing materials which will respond in a different manner to different wavelength lasers or which can be switched, by an external stimulus, from one optical state to another.

An excellent example of this type of technology may be seen in U.S. Pat. No. 4,236,156, issued to the inventor herein. This patent discloses a technique for writing and erasing data into a thin film of thermochromic or pressure sensitive film utilizing a combination of lasers and/or surface acoustic waves to affect an optically discernible phase change in the film material.

Another example of this type of technology is disclosed in U.S. Pat. No. 4,009,488, issued to Ronald S. Smith. The Smith patent discloses a video technology which includes a stress wave propagating apparatus which defines a viewing plane and includes a device for initiating propagation of stress waves in a first scanning direction. A light emitting apparatus is utilized to provide a second scan line and the emitted light is modulated by a video signal and interacts with the stress wave to result in a video display. These early designs have been proven to be complex and bulky systems which often rely on extensive support circuitry to operate.

SUMMARY OF THE INVENTION

It is therefore one object of the present invention to provide an improved random access memory.

It is another object of the present invention to provide an improved random access memory utilizing phase change materials.

It is yet another object of the present invention to provide an improved random access memory utilizing phase change materials which does not require extensive support circuitry.

It is another object of the present invention to provide an improved random access memory utilizing phase change materials which is nonvolatile in nature.

The foregoing objects are achieved as is now described. The memory device of the present invention utilizes two overlapping films of a phase change material which exhibits an optically discernible phase change at any portion thereof which is subjected to a selected external stimulus and which exhibits a hysteresis effect such that any such portion is substantially unchanged after the external stimulus is removed. Various phase change materials are disclosed which respond to changes in pressure, temperature or electric field intensities to vary the transmission characteristics of a selected portion of a film of such material from substantially opaque to translucent. One of the two overlapping films is then utilized to record digital data by changing the phase of the material at selected portions thereof. A single selected portion of the second film is then rendered translucent and utilized in conjunction with a powerful light source and a photodetector to ascertain the phase of a particular portion of the first film which underlies the single selected portion of the second film.

BRIEF DESCRIPTION OF THE DRAWINGS

The novel features believed characteristic of the invention are set forth in the appended claims. The invention itself; however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PRESENT INVENTION

There are numerous materials which exhibit an optically discernible phase change in response to external stimuli. Compounds which respond primarily to temperature changes include certain ternary halides such as $Cu_2HgI_4$, and some transition metal oxides such as vanadium oxide. Other compounds respond primarily to pressure, such as the rare earth monochalcogenides, including samarium sulfide and other gadolinium and lanthanum compounds. Still other organometallic compounds respond to various electric fields. An example of these compounds is tetracyanoquinodimethane (TCNQ).

Almost any of these phase transition materials can be utilized in the random access memory of the present invention; however, as those skilled in this art will appreciate, it will be necessary to provide a mechanism for generating the necessary external stimulus associated with a particular class of materials or a selected material. Therefore, for purposes of illustration, the embodiment disclosed herein utilizes samarium sulfide, one of the rare earth monochalcogenides. While this depicted embodiment will therefore function with any of the pressure sensitive materials, it should be apparent that by altering the construction slightly these techniques will operate with any of the known materials which exhibit an optically discernible phase change when subjected to a selected stimulus.

Figure 1:
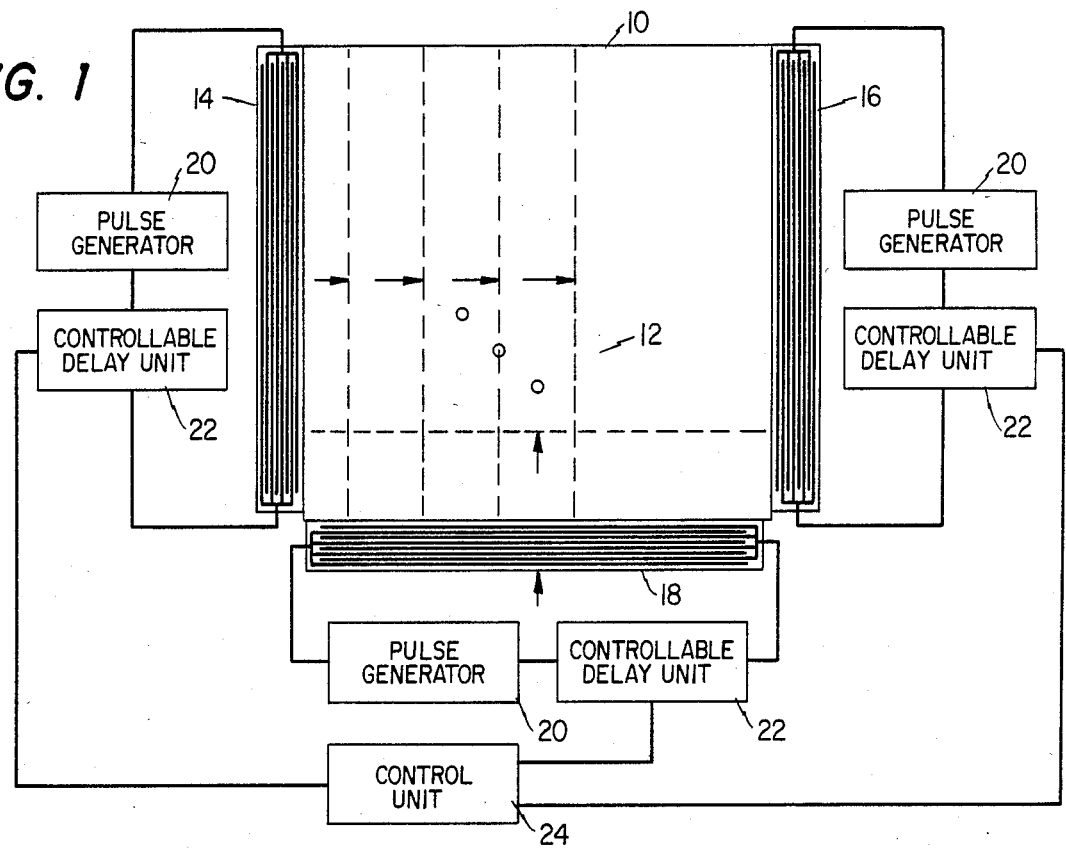
FIG. 1 is a partially diagrammatic and partially schematic view of one novel storage medium of the random access memory of the present invention.

Referring now to the figures, and in particular with reference to FIG. 1, there is depicted a partially diagrammatic, partially schematic view of one novel storage medium of the random access memory of the present invention. As can be seen, the storage medium includes a substrate 10 constructed of a translucent piezoelectric material such as potassium dihydrogen phosphate, lithium niobate crystal or quartz. Deposited on the surface of substrate 10 is a thin film of pressure sensitive material 12. In a preferred embodiment of the present invention, film 12 is provided utilizing one of the rare earth monochalcogenides such as samarium sulfide, samarium selenide, samarium telluride or samarium oxide. Like other known phase transition materials, these pressure sensitive films exhibit a hysteresis effect. That is, a phase change brought about by the application of an external pressure will remain unchanged after the removal of that pressure, if the film of material is biased at the proper point in its hysteresis loop. An explanation of this hysteresis effect can be seen in U.S. Pat. No. 4,236,156, issued to the inventor herein.

Samarium sulfide, one of the preferred materials for implementing the present invention, is particularly useful in the display of visual information because its semiconductor band edge is about 5000 Angstroms. Samarium sulfide has a low absorption in its semiconductor state and a high absorption in its metal state in both the visible and infrared spectra.

A thin film 12 of samarium sulfide is deposited on substrate 10 utilizing standard vacuum deposition techniques or any other suitable technique. By utilizing a substrate which has a slightly different coefficient of thermal expansion it is possible to bias the film with a selected stress by heating the substrate during such deposition techniques. In this manner, it is possible to provide a prebiased film of pressure sensitive material which will exhibit an optically discernible phase change in response to pressures greater than a preselected threshold pressure. Of course, those skilled in the art will appreciate that various dopant additives may be utilized in conjunction with a pressure sensitive film material to adjust this desired threshold pressure.

As taught in the art, it is possible to generate a sufficient stress to "switch" regions of film 12 by utilizing surface acoustic waves. Surface acoustic waves are elastic sonic waves which travel along the free surface of a solid having both longitudinal and shear components with zero normal force in the plane of the surface. Surface acoustic waves can be generated at the free surface of certain piezoelectric crystals by applying a voltage to the crystal which causes elastic dilation or contraction of the crystal, resulting in the generation of surface acoustic waves along the surface. The energy of these waves is confined to the interface between the crystal surface and the air or, in the case of a film on the surface of the crystal, within the film. These waves propagate along the surface of such crystals at relatively high speeds. For example, in lithium niobate crystals or quartz, these waves travel at a velocity of about $3 \times 10^5$ centimeters per second.

Figure 2:
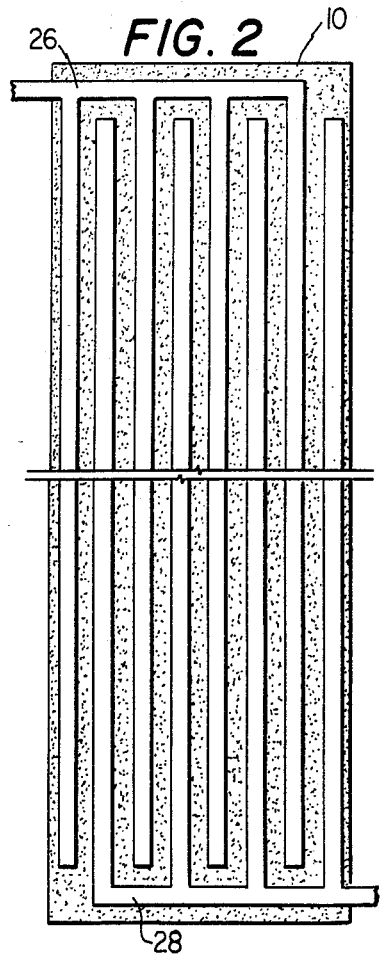
FIG. 2 is a greatly enlarged view of one surface acoustic wave transducer of the storage medium of FIG. 1.

By applying a suitable voltage to these crystals, a surface acoustic wave can be generated which has sufficient energy to alter the optical characteristics of the pressure sensitive film. A particularly efficient device for generating such surface acoustic waves is an interdigital transducer which may be formed on piezoelectric substrate 10. The depicted embodiment of the present invention utilizes three such interdigital transducers 14, 16 and 18. Each interdigital transducer consists of two electrodes disposed on the upper surface of the piezoelectric substrate, each having a series of spaced fingers which are interdigitally spaced to form electrode pairs in the manner which is depicted in FIG. 2. As can be seen, each interdigital transducer is coupled to a pulse generator 20 which is utilized to generate a pulse of sufficient power and polarity to generate a pattern of regions of the density required for the memory device. An associated controllable delay unit 22 is coupled with each pulse generator to permit the pulse being applied to the interdigital transducers to be timed in an extremely accurate manner.

As can be seen, each controllable delay unit 22 is coupled to a single control unit 24 which generates suitable control signals which may be utilized to vary the transmission time of each individual pulse emitted by any of the pulse generators. Control unit 24 may be implemented utilizing an appropriately programmed microprocessor or microcomputer. Those ordinarily skilled in the art will appreciate that by utilizing control unit 24 and controllable delay units 22, it will be possible to generate pulses at a fixed frequency and at selected times. It will therefore be possible to generate three surface acoustic wave pulses which can intersect at any point in the surface of pressure sensitive film 12. Again, assuming that each surface acoustic wave pulse creates a region of stress slightly greater than one third of the threshold stress necessary to switch the state of film 12, only those regions where all three surface acoustic wave pulses intersect will experience an external stress sufficiently great to switch a region of film 12. As an example, the pulsewidth associated with a five hundred megahertz bandwidth signal is sufficiently narrow that regions of film 12 on the order of three microns in diameter may be switched. Of course, higher frequency pulses may be utilized to generate smaller regions in film 12 and a correspondingly higher number of digital bits may be stored in a fixed area of memory.

Referring now to FIG. 2, there is depicted a greatly enlarged view of one surface acoustic wave transducer of the novel storage medium of FIG. 1. As can be seen, the interdigital transducer depicted in FIG. 2 comprises electrodes 26 and 28, each of which includes a plurality of spaced finger electrodes which are interdigitally spaced to form a plurality of electrode pairs. Electrodes of a sufficiently minute nature may be simply and easily formed on the piezoelectric substrate by utilizing commonly known deposition techniques such as are commonly utilized in the manufacture of a metallization layer in an integrated circuit device. By utilizing electrodes of this design, an electric field created between electrodes 26 and 28 will cause a deformation of substrate 10 which in turn creates a surface acoustic wave on the surface of substrate 10 and in film 12. Of course, it should be apparent that negative pulses can be utilized to "erase" a region which has previously been "written" by the intersection of three positive pulses.

Figure 3:
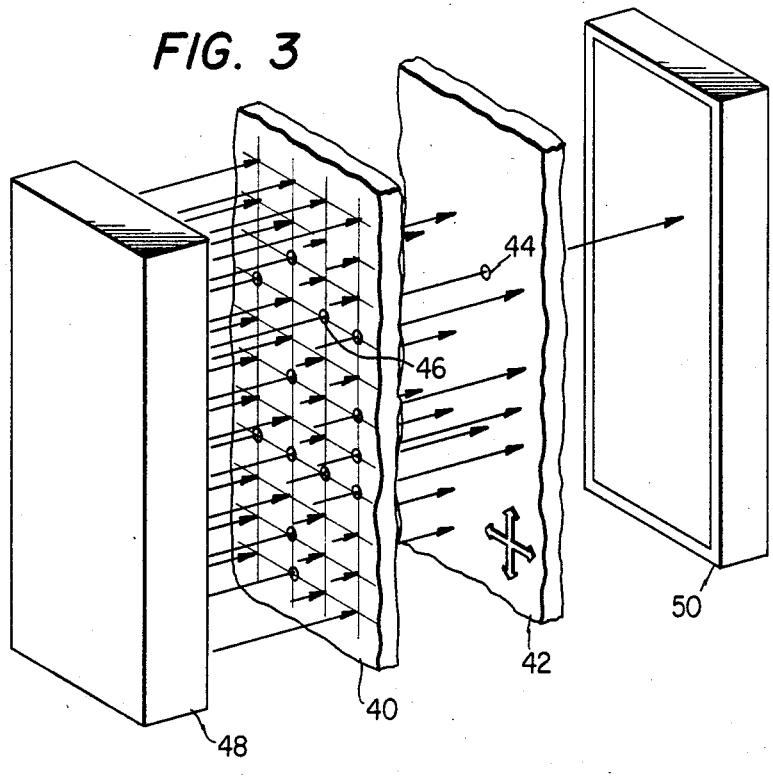
FIG. 3 is a simplified and exploded perspective view of a section of the novel random access memory device of the present invention.

Referring now to FIG. 3, there is depicted a simplified exploded perspective view of the novel random access memory device of the present invention. As can be seen, in a preferred embodiment of the memory device of the present invention, two overlapping films 40 and 42 are utilized, each having an associated translucent piezoelectric substrate (not shown). Films 40 and 42 are exploded apart in FIG. 3 to assist in the explanation herein; however, in actual practice such separation will be minimal.

Film 40 serves as the storage medium of the memory device of the present invention, having a plurality of regions, each of which may be transformed from the substantially opaque metal phase to a translucent semiconductor phase by the intersection of three surface acoustic waves generated by pulse generators 20. Film 42 then serves as a "mask" permitting a single region of film 40 to be accessed or "read." This is accomplished by transforming a single region 44 in film 42 from the opaque metal phase to the translucent semiconductor phase by selective generation of three surface acoustic waves which intersect at region 44.

Therefore, in order to "read" the digital data stored at region 46 of film 40, a region 44 in film 42, which underlies region 46, is transformed to its translucent phase. An associated source of radiant energy, such as laser source 48, is utilized to generate an incident beam of radiation across the surface of film 40. Since region 44 of film 42 directly underlies region 46 of film 40, the radiation generated by laser source 48 will pass through region 46 and region 44 and impact photodetector 50. Thus, it is possible to ascertain the phase of any selected region of film 40 by writing a region of translucent semiconductor phase in film 42 which directly underlies the selected region of film 40. The absence or presence of light transmitted through that region of film 42 will establish the phase of film 40.

As an additional benefit of the novel memory device of the present invention, it will be possible to simultaneously access multiple regions of film 40 by writing multiple mask regions in film 42 and by utilizing a separate photodetector for each region. Alternatively, by utilizing a separate photodetector for multiple regions of film 40, it will be possible to simultaneously access a digital bit in each of the multiple regions of film 40.

Although the invention has been described with reference to a specific embodiment, this description is not meant to be construed in a limiting sense. Various modifications of the disclosed embodiment as well as alternative embodiments of the invention will become apparent to persons skilled in the art upon reference to the description of the invention. It is therefore contemplated that the appended claims will cover any such modifications or embodiments that fall within the true scope of the invention.

What is claimed is:

1. A memory device comprising:
    two films of phase change material disposed one above the other, said material exhibiting an optically discernible phase change from a first phase to a second phase at any portion thereof subjected to a selected external stimulus and exhibiting hysteresis such that said optically discernible phase change at any such portion is substantially unchanged after said selected external stimulus is removed;
    first means for providing said selected external stimulus to a plurality of portions of a first of said two films of phase change material;
    second means for providing said selected external stimulus to a selected portion of a second of said two films of phase change material, said selected portion of said second film of phase change material underlying a particular portion of said first film of phase change material;
    a source of radiant energy disposed adjacent to said first film of phase change material, said radiant energy exhibiting a first transmission characteristic through said first phase of said phase change material and a second transmission characteristic through said second phase of said phase change material; and
    detector means disposed adjacent to said second film of said phase change material for detecting radiant energy transmitted through said selected portion of said second film of phase change material wherein the phase of said particular portion of said first film of said phase change material may be ascertained.

2. The memory device according to claim 1 further including a piezoelectric substrate disposed beneath each of said two films of phase change material.

3. The memory device according to claim 2 wherein said piezoelectric substrate comprises lithium niobate crystal.

4. The memory device according to claim 2 wherein said piezoelectric substrate comprises quartz.

5. The memory device according to claim 2 wherein each of said two films of phase change material comprises a thin film of a rare earth monochalcogenide disposed on said piezoelectric substrate.

6. The memory device according to claim 5 wherein each of said two films of phase change material comprises a thin film of samarium sulfide disposed on said piezoelectric substrate.

7. The memory device according to claim 6 wherein said selected external stimulus comprises an external stress in excess of a predetermined threshold stress.

8. The memory device according to claim 7 wherein said first means comprises a plurality of acoustic wave transducers disposed on the surface of said piezoelectric substrate for generating surface acoustic waves on the surface thereof and in said first film of said phase change material wherein an external stress greater than said predetermined threshold stress is created at any point where a plurality of said surface acoustic waves intersect.

9. The memory device according to claim 8 wherein each of said plurality of acoustic wave transducers includes at least one pair of electrodes on said piezoelectric substrate spaced apart in substantially parallel relation such that when an electric field is created between said at least one pair of electrodes said piezoelectric substrate undergoes deformation creating a surface acoustic wave on the surface thereof and in said first film of said phase change material.

10. The memory device according to claim 7 wherein said second means comprises a plurality of acoustic wave transducers disposed on the surface of said piezoelectric substrate for generating surface acoustic waves on the surface thereof and in said second film of phase change material wherein an external stress greater than said predetermined threshold stress is created at any point where a plurality of said surface acoustic waves intersect.

11. The memory device according to claim 10 wherein each of said plurality of acoustic wave transducers includes at least one pair of electrodes on said piezoelectric substrate spaced apart in substantially parallel relation such that when an electric field is created between said at least one pair of electrodes said piezoelectric substrate undergoes deformation creating a surface acoustic wave on the surface of said second film of phase change material.

12. The memory device according to claim 1 wherein said source of radiant energy comprises a laser.

13. The memory device according to claim 1 wherein said detector means comprises a photodetector.

14. A random access memory device comprising:
two films of phase change material disposed one above the other, said material exhibiting a phase change from a substantially opaque first phase to a translucent second phase at any portion thereof subjected to a selected external stimulus and exhibiting hysteresis such that said phase change at any such portion is substantially unchanged after said external stimulus is removed;
first means for providing said selected external stimulus to a plurality of portions of a first of said two films of phase change material;
second means for providing said selected external stimulus to a selected portion of a second of two films of phase change material, said selected portion of said second film of phase change material underlying a particular portion of said first film of phase change material;
a light source disposed adjacent to said first film of phase change material; and
a photodetector disposed adjacent to said second film of said phase change material for detecting the presence or absence of light transmitted through said selected portion of said second film of phase change material wherein the phase of said particular portion of said first film of phase change material may be ascertained.

15. The memory device according to claim 14 further including a piezoelectric substrate disposed beneath said two films of phase change material.

16. The memory device according to claim 15 wherein said piezoelectric substrate comprises lithium niobate crystal.

17. The memory device according to claim 15 wherein said piezoelectric substrate comprises quartz.

18. The memory device according to claim 15 wherein each of said two films of phase change material comprises a thin film of a rare earth monochalcogenide disposed on said piezoelectric substrate.

19. The memory device according to claim 18 wherein each of said two films of phase change material comprises a thin film of samarium sulfide disposed on said piezoelectric substrate.

20. The memory device according to claim 19 wherein said selected external stimulus comprises an external stress in excess of a predetermined threshold stress.

21. The memory device according to claim 20 wherein said first means comprises a plurality of acoustic wave transducers disposed on the surface of said piezoelectric substrate for generating surface acoustic waves on the surface thereof and in said first film of said phase change material wherein an external stress greater than said predetermined threshold stress is created at any point where a plurality of said surface acoustic waves intersect.

22. The memory device according to claim 21 wherein each of said plurality of acoustic wave transducers includes at least one pair of electrodes on said piezoelectric substrate spaced apart in substantially parallel relation such that when an electric field is created between said at least one pair of electrodes said piezoelectric substrate undergoes deformation creating a surface acoustic wave on the surface thereof and in said first film of said phase change material.

23. The memory device according to claim 20 wherein said second means comprises a plurality of acoustic wave transducers disposed on the surface of said piezoelectric substrate for generating surface acoustic waves on the surface thereof and in said second film of phase change material wherein an external stress greater than said predetermined threshold stress is created at any point where a plurality of said surface acoustic waves intersect.

24. The memory device according to claim 23 wherein each of said plurality of acoustic wave transducers includes at least one pair of electrodes on said piezoelectric substrate spaced apart in substantially parallel relation such that when an electric field is created between said at least one pair of electrodes said piezoelectric substrate undergoes deformation creating a surface acoustic wave on the surface of said second film of phase change material.

25. The memory device according to claim 14 wherein said light source comprises a laser.

* * * * *